United States Patent [19]

Hideshima et al.

[11] Patent Number: 5,128,277
[45] Date of Patent: Jul. 7, 1992

[54] CONDUCTIVITY MODULATION TYPE SEMICONDUCTOR DEVICE AND METHOD FOR MANUFACTURING THE SAME

[75] Inventors: Makoto Hideshima, Tokyo; Wataru Takahashi; Masahi Kuwahara, both of Kawasaki, all of Japan

[73] Assignee: Kabushiki Kaisha Toshiba, Kawasaki, Japan

[21] Appl. No.: 593,461

[22] Filed: Oct. 3, 1990

Related U.S. Application Data

[63] Continuation of Ser. No. 205,544, Jun. 8, 1988, abandoned, which is a continuation of Ser. No. 827,013, Feb. 7, 1986, abandoned.

[30] Foreign Application Priority Data

Feb. 20, 1985 [JP] Japan ................... 60-30577

[51] Int. Cl.$^5$ .......................... H01L 21/225
[52] U.S. Cl. ..................... 437/161; 148/DIG. 12
[58] Field of Search .............. 437/29, 247, 161; 357/38; 148/DIG. 12

[56] References Cited

U.S. PATENT DOCUMENTS

| | | | |
|---|---|---|---|
| 3,312,880 | 4/1967 | Longo et al. | 357/38 |
| 3,324,359 | 6/1967 | Gentry | 357/38 |
| 3,659,334 | 5/1972 | Becke et al. | 357/38 |
| 3,886,003 | 5/1975 | Takagi et al. | 437/156 |
| 4,364,073 | 12/1982 | Becke et al. | 357/23.4 |
| 4,383,268 | 5/1983 | Martinelli et al. | 357/34 |
| 4,441,115 | 4/1984 | Dahlberg | 357/38 |
| 4,587,713 | 5/1986 | Goodman et al. | 357/43 |
| 4,631,564 | 12/1986 | Neilson et al. | 357/38 |
| 4,638,552 | 1/1987 | Shimbo et al. | 357/49 |
| 4,639,754 | 1/1987 | Wheatley, Jr. et al. | 357/23.3 |
| 4,738,935 | 4/1988 | Shimbo et al. | 148/DIG. 12 |
| 4,935,386 | 6/1990 | Nakagawa et al. | 148/DIG. 12 |

FOREIGN PATENT DOCUMENTS

| | | |
|---|---|---|
| 1514727 | 6/1969 | Fed. Rep. of Germany . |
| 63-50013 | 3/1988 | Japan ............... 148/DIG. 12 |
| 2072422 | 9/1981 | United Kingdom . |
| 2088631 | 6/1982 | United Kingdom . |

OTHER PUBLICATIONS

Goodman et al, IEEE International Electron Device Meeting; Technical Digest, Dec. 4, 1983, pp. 79-82 (exr's personal copy).
Shimbo, M., et al, "Silicon-to-Silicon Direct Bonding Method", J. Appl. Phys. 60(8) Oct. 1986, pp. 2987-2989.
Furukawa, K., "Lattice Configuration and Electrical Properties of the Interface of Direct Bonded Silicon", Extended Abstracts 18th(1986) Conference on Solid State Devices and Materials, Tokyo, 1986, pp. 533-536.

*Primary Examiner*—Olik Chaudhuri
*Assistant Examiner*—G. Fourson
*Attorney, Agent, or Firm*—Finnegan, Henderson, Farabow, Garrett and Dunner

[57] ABSTRACT

A conductivity modulation type semiconductor device comprises a semiconductor anode substrate of a P type having two surfaces, a semiconductor substrate of an N type having two surfaces, the semiconductor substrate having a high impurity layer-like region on one surface thereof and a low concentration drain region on the other surface thereof, a body region of P type formed in the drain region and exposed at one surface of the semiconductor substrate, source regions of an N type formed in the body region and exposed at the other surface of the semiconductor substrate, and a gate layer formed within the isulating layer, which extends between the source and drain regions, on the body region. The other surface of the anode substrate is polished and is intimately joined to the polished surface of the semiconductor substrate to form a junction layer therebetween.

6 Claims, 2 Drawing Sheets

IMPURITY CONCENTRATION

CONDUCTIVITY MODULATION TYPE SEMICONDUCTOR DEVICE AND METHOD FOR MANUFACTURING THE SAME

This application is a continuation of application Ser. No. 205,544 filed Jun. 8, 1988, now abandoned which is a continuation of application Ser. No. 827,013 filed Feb. 7, 1986, now abandoned.

BACKGROUND OF THE INVENTION

This invention relates to a conductivity modulation type semiconductor device of a four-layer structure having a region on the drain electrode side of an insulated gate, vertical double-diffused metal oxide semiconductor field effect transistor (VDMOSFET), the conductivity type of which is opposite to that of the drain region.

The semiconductor device of this type is obtained by forming an N⁻type drain region, by a vapor growth method, on a P type semiconductor layer and forming by a diffusion method in the drain region a region of one conductivity type (hereinafter referred to as a P type body region) and a region having a conductivity type opposite to said one conductivity type and acting as a source region.

Furthermore, it is also known that an N⁺type thin layer is formed between the P type semiconductor layer and the N⁻type drain region so as to improve the semiconductor characteristic. In such a semiconductor device an N⁺type layer-like region is formed by the vapor growth method on a P type semiconductor region and then an N⁻type drain region is formed by the vapor growth method on the surface of the resultant structure.

FIG. 1 is a cross-sectional view showing a conductivity modulation type semiconductor device having said N⁺type layer-like region.

As set forth above, N⁺type thin layer-like region 12 and N⁻type drain region 13 are sequentially formed, in that order, on P type semiconductor layer 11 which functions as an anode region. A plurality of separated P type body regions 14 are formed in the drain region. An N type region acting as a source region 15 is formed by the diffusion method in the P type body region 14. Source region 15 and P type body region 14 are formed in the upper surface portion of the drain region such that they are exposed at the surface of the resultant semiconductor substrate. Insulating layer 19 is formed on the exposed surface area of the semiconductor substrate such that both the end portions of insulating layer 19 are located, respectively, on source region 15 in P type body region 14 and on source region 15 in adjacent P type body region 14 with gate layer 17 buried in insulating layer 19. The portion of the insulating layer overlying the gate layer is removed to partially expose the gate layer. Gate electrode 18 is formed on the exposed surface of the gate layer, source electrode 21 is formed on the exposed surface of the P type body region and source region and anode electrode 20 is formed on exposed surface of P type semiconductor layer 11. In this way, a conductivity modulation type semiconductor device can be produced.

When a voltage is applied to the gate electrode of the conductivity modulation type semiconductor device, a channel inversion layer is formed at the surface of the P type body region, which turns the semiconductor device ON. As a result, electrons move from the source region through the channel layer into the drain region. When a forward bias is also applied across the anode region and the drain region, holes are injected from the anode region into the drain region. With the device in the ON state, the electrons and holes are injected into the drain region to permit conductivity modulation.

Since in the conventional VDMOSFET only electrons, i.e. majority carriers, are injected into the drain region, a greater resistance occurs in the electron flow if the drain region has a greater thickness or a lower concentration level. Such resistance represents most of the ON resistance.

In the conductivity modulation type MOSFET, the N⁻type drain region suffers conductivity modulation, which reveals a very small resistance component. That is, a higher withstand voltage is obtained which produces a smaller ON resistance even when the drain region has a greater thickness or a lower concentration level.

On the other hand, a portion of the minority carriers from the anode region is injected into the drain region where they are stored as excess minority carriers. Even if, in order to turn the MOSFET OFF, the channel is closed with the gate application voltage set at a zero level and thus the flow of electrons is stopped, the MOSFET cannot attain its OFF state until the minority carriers so stored are all moved out of the drain region.

Furthermore, during the period in which the electrons left in the drain region pass through the anode region, a fresh injection of minority carriers from the anode region is induced to lengthen the turn-off time.

However, the effect of the injection of the minority carriers from the anode region into the drain region is reduced due to the presence of the N⁺type thin layer-like region, thus enabling a reduction of the total amount of minority carriers stored in the N⁻type drain region. The inventors have found that, when the N⁺type layer-like region is so formed as to have a specific resistance of 1 to 2 Ω·cm and a thickness of 15 μm, the turn-off time can be reduced to about one-fifth that when no such a thin N⁺type layer-like region is formed. The N⁺type thin layer-like region somewhat increases the ON resistance despite its positive effect. If the N⁺type thin layer-like region is properly controlled in impurity concentration level and in thickness, the increase of the ON resistance can be set within a negligible range and at the same time the turn-off time can be reduced to a greater extent.

In the conductivity modulation MOSFET, the N⁺type layer-like region and N⁻type drain region are sequentially formed by the vapor growth method on the P⁺type semiconductor layer. In this vapor growth method, a P type impurity, usually boron, contained in the P type semiconductor layer has a greater possibility of being incorporated in the subsequent vapor growth layer. Where there is a greater difference in concentration level between the N⁺type layer-like region and the N⁻type region acting as a drain region, that impurity incorporated in the N⁺type region can be disregarded, but that impurity incorporated in the N⁻type region provides an inversion layer. It is therefore possible to provide a concentration profile of P⁺(anode region 11)–N⁺(region 12)

–P (inversion layer)–N (drain region 13)

as shown in FIG. 2.

In the conductivity modulation type MOSFET having a source-to-drain withstand voltage of about 500 V and a shorter turn-off time on the order of several microseconds, it is preferred that the specific resistance of the $N^-$ type drain region be 20 to 30 $\Omega\cdot$cm and that the specific resistance of an $N^-$ type layer-like region be 1 to 2 $\Omega\cdot$cm. It is very difficult to form the $N^+$ type layer-like region and $N^-$ type drain region (having such a concentration difference) by the vapor growth method on the $P^+$ type semiconductor layer (acting as the anode region) without forming the inversion layer. It is, therefore, nearly impossible to stably mass-produce conductivity modulation type semiconductor devices.

SUMMARY OF THE INVENTION

An object of this invention is to provide a novel conductivity modulation type semiconductor device and a method for manufacturing the same, which enables a high withstand voltage and high-speed characteristics through use of a joint technique.

That is, a semiconductor substrate of one conductivity type (a first conductivity type) having a concentration difference as an essential factor is joined to a semiconductor substrate having a conductivity type (a second conductivity type) different from said first conductivity type to enable integrated semiconductor assembly. In this way, a conductivity modulation type semiconductor device can be fabricated.

The use of the aforementioned joint technique permits a boundary face to be formed between the semiconductor substrates. By the next heating process, impurities in the substrate are rediffused through the boundary face, so that an inversion layer is formed at the boundary face which is metallographically different from a bulk system. In this case a grain boundary is assumed to have been formed from a metallographical standpoint.

In this connection it should be noted that the inversion layer is not sharply defined between the substrates and assumed to be somewhat shifted due to the heating technique. includes such a shifted junction layer.

Both semiconductor substrates are intimately joined, independently of a difference in conductivity and in impurity concentration and in an atmosphere free from any foreign matter, with their corresponding mirror-polished, somewhat moist surfaces in contact with each other.

DETAILED DESCRIPTION OF THE PREFERRED EMBODIMENT

Figure 1:
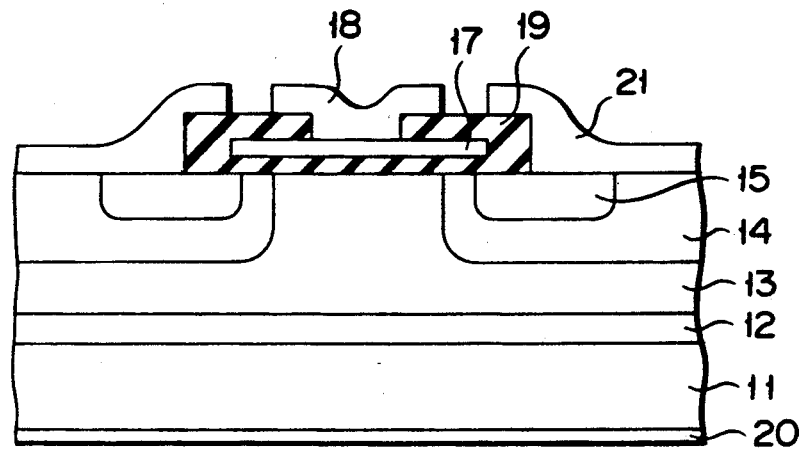
FIG. 1 is a cross-sectional view showing a conventional conductivity modulation type semiconductor device.
Figure 2:
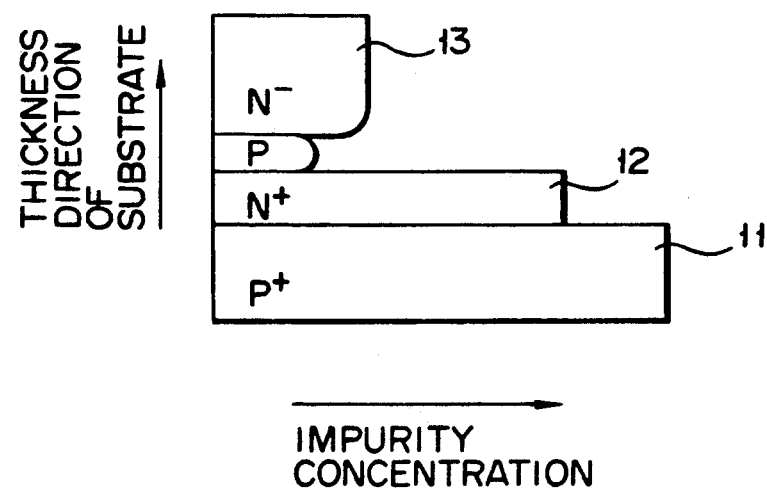
FIG. 2 is a view showing an impurity concentration profile of the semiconductor device shown in FIG. 1.
Figure 3:
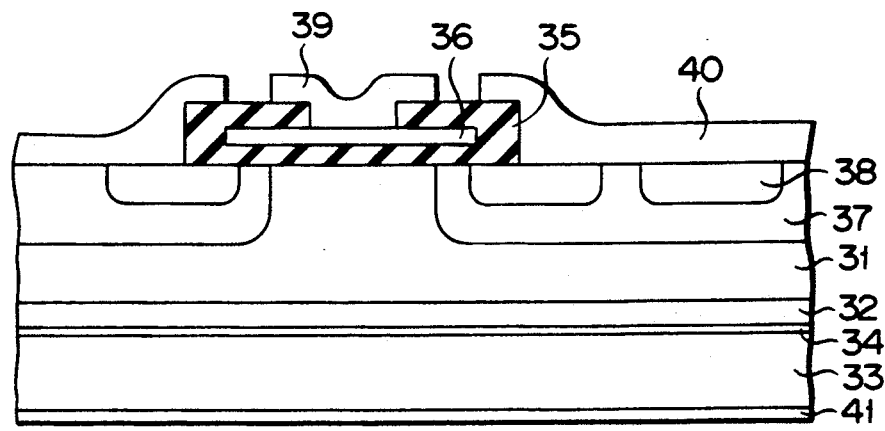
FIG. 3 is a cross-sectional view showing a conductivity modulation type semiconductor device according to one embodiment of this invention.
Figure 4:
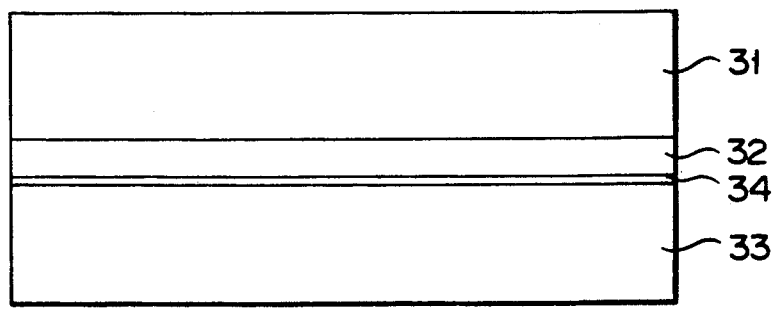
FIG. 4 is a cross-sectional view showing a silicon substrate assembly in the manufacturing process of the semiconductor device shown in FIG. 3.

A conductivity modulation semiconductor device according to one embodiment of this invention will be explained below in connection with the manufacturing steps.

The specific resistance and thickness of an $N^-$ type drain region are predetermined in order to obtain a desired source-to-drain withstand voltage. For example, the drain region has a specific resistance of 20 to 30 $\Omega\cdot$cm and thickness of 50 to 60 $\mu$m at a withstand voltage of 500 V and a specific resistance of 50 to 60 $\Omega\cdot$cm (an impurity concentration of below $1\times10^{14}$ cm$^{-3}$) and thickness of about 100 $\mu$m at a withstand voltage of 1,000 V. To obtain such an impurity concentration, phosphorus, for example, may be used as a dopant.

With these considerations, a planar $N^-$ type silicon substrate 31 is prepared and an impurity, such as phosphorus, arsenic or antimony, is ion implanted into one surface portion of the silicon substrate and then the surface of the resultant structure is heat treated to form $N^+$ type silicon layer 32. Like the $N^-$ type silicon substrate, $P^+$ type silicon substrate 33 containing a boron of $1\times10^{19}$ to $10^{21}$ cm$^{-3}$, preferably $1\times10^{20}$, is prepared and it is joined to the $N^-$ type silicon substrate by the following method to provide an integral structure.

The $N^-$ type silicon substrate 31 and $P^+$ type silicon substrate 33 (anode substrate) are sheet-like in configuration and rigid in nature. First, the upper surface of the $P^+$ type silicon substrate 33 and surface of the $N^-$ type silicon substrate 31 ($N^+$ type silicon layer 32) are mirror-polished to form first and second mirror faces having a surface roughness of below 500 Å. Depending upon the surface conditions, a pretreatment process is carried out, using $H_2O_2+H_2SO_4$-HF-diluted H, to eliminate a grease and stain film on the respective faces of the respective substrates. Then, the mirror faces of the silicon substrates are washed with clean water for a few minutes and dried by, for example, a spinner at room temperature. This process eliminates excessive moisture, while moisture assumed to have been absorbed on or in the silicon mirror faces of the respective substrates is left as it is. It is, therefore, necessary to avoid a heat-drying step at above 100° C. at which such moisture evaporates. After such step, the silicon mirror faces are placed in a clean outer atmosphere of below Class 1 and intimately joined to each other with no foreign substance left therebetween, providing a semiconductor substrate assembly. In this connection it is to be noted that the outer atmosphere may be an inert atmosphere, such as nitrogen, or a reducing atmosphere. The semiconductor substrate assembly so obtained is heated at above 200° C., preferably 1,000° to 1,200° C. to increase the joint strength between the silicon substrates.

A boundary face 34 is formed by the joining step between the semiconductor substrates. The semiconductor assembly so obtained has no thermal nor electrical conduction barrier at the boundary face and a greater physical joint strength can be obtained at the junction. This structure can be treated in the same way as a single structure.

The resultant semiconductor assembly is of a $P^+$-$N^+$-$N^-$ structure. The surface of $N^-$ type silicon substrate 31 is polished to a predetermined depth and, in this way, it is adjusted to a depth necessary for the aforementioned drain region.

At the next step, as in the case of a known VDMOS-FET, a self-aligning method is used for the resultant structure with a polysilicon layer as a mask to provide a conductivity modulation type MOSFET.

Approximately 1,000 Å-thick silicon dioxide layer 35 is deposited on the N⁻type silicon layer, i.e., on the exposed surface of the P⁺-N⁺-N⁻ semiconductor structure and then a 2,000 to 3,000 Å-thick polycrystalline layer for gate layer 36 as described below is selectively formed on silicon dioxide layer 35. With the polysilicon layer as a mask, an N type impurity, such as boron, is ion implanted through the relatively thin silicon dioxide layer 35 (hereinafter referred to as an insulating layer) into N⁻type silicon substrate 31 and annealed to form a plurality of P type body regions 37.

Then, the insulating layer portion where the polysilicon layer is not deposited is removed by a photoetching method to expose the surfaces of body regions 37. Arsenic or phosphorus is diffused into the exposed surface area of P type body region 37 to form two N type regions 38, acting as source regions, in P type body region 37. Then, a CVD film is deposited on polysilicon layer 36 to bury polysilicon layer 36 in the insulating layer, noting that the insulating layer is also covered on the exposed surface portion of the N⁻type silicon substrate, that is, on the surface portion of N type region 38 and P type body region 37.

That portion of the insulating layer formed opposite to the polysilicon layer is removed and aluminum, for example, is deposited to provide gate electrode 39. The aluminum is also deposited on P type body region 37 to provide source electrode 40. Furthermore, gold is deposited on the exposed surface of the P⁺type silicon substrate 33 to form anode electrode 41. By heat treatment for forming said regions and layers, holes in silicon substrate 33 are rediffused into N⁺type silicon layer 32, so that P type inversion layer 34 is formed in N⁺type silicon layer. A PN junction is formed between the P type inversion layer 34 and N⁺type silicon layer 32. In this way, a conductivity modulation type MOSFET can be produced.

The turn-off time was measured for a conventional semiconductor device and a semiconductor device manufactured according to this invention and found that it was 700 nsec for the conventional semiconductor device and 140 nsec for the present semiconductor device, noting that this measurement was carried out by a sample which uses a current density of 100 A/cm² and an ON voltage of 2.5 V.

A semiconductor device according to another embodiment of this invention is explained below with reference to FIG. 5.

Figure 5:
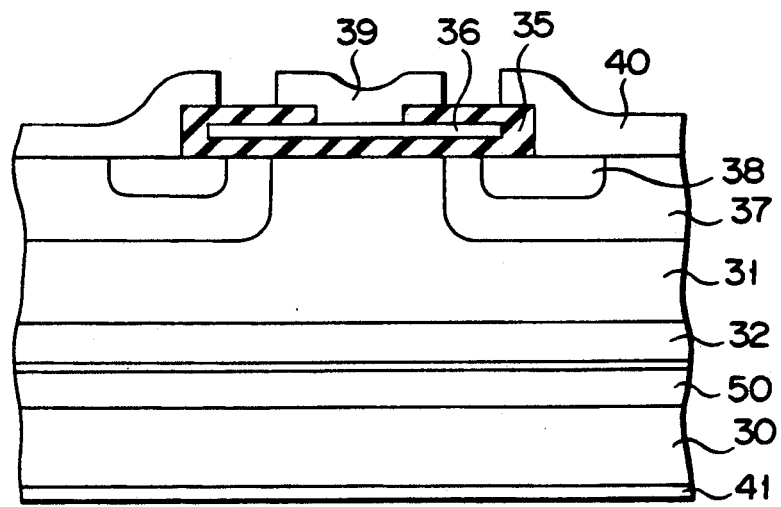
FIG. 5 is a cross-sectional view showing a semiconductor device according to another embodiment of this invention.

In the embodiment shown in FIG. 5, P⁻type silicon layer 50 with a boron concentration of $1 \times 10^{15}$ to $10^{18}$ cm⁻³ is deposited by the vapor growth method on a P⁺type silicon body thereby forming silicon substrate 33. The resultant structure is joined at P⁻type silicon layer 50 to silicon substrate 31. Then, the same manufacturing steps as those explained in connection with the first embodiment are carried out to provide a conductivity modulation type MOSFET.

In the first embodiment, since the impurity concentration of P⁺type silicon substrate 33 is higher than that of N⁺type layer 32 of silicon substrate 31, impurity atoms contained in P⁺type silicon substrate 33 are rediffused into N⁺type silicon layer 32 due to a heat load applied in the manufacturing process, causing inversion layer 34 to form on the N⁺type silicon layer side due to a sequential inversion into a P type. The inversion layer is usually about 10 μm in thickness. In the first embodiment, for example, the N⁺type silicon layer initially forms at a thickness of 5 to 30 μm. In this way, the N⁺type silicon layer is formed such that the whole layer is prevented from being inverted due to a progressive rediffusion.

According to the second invention the aforementioned inversion phenomenon can be suppressed due to the presence of the P⁻type layer, so that control of a high impurity concentration layer is easier.

As explained in more detail above, the conductivity modulation type semiconductor device of this invention can positively reduce the turn-off time to about one-fifth that of the conventional conductivity modulation type semiconductor device. The use of the present semiconductor device for motor control is thus to be expected.

Furthermore, according to this invention the difficulty of mass-production is markedly decreased in comparison with the use of the vapor growth method, thus assuring lower costs due to mass-production.

What is claimed is:

1. A method of manufacturing a conductivity modulation type semiconductor device, comprising the steps of:

preparing a semiconductor anode substrate of a first conductivity type, having a first impurity concentration, and having first and second surfaces;

preparing a semiconductor substrate of a second conductivity type having first and second surfaces, said semiconductor substrate having a layer-like region, with a second conductive impurity concentration, formed on said first surface thereof, said second conductive impurity concentration being lower than said first impurity concentration, and having a drain region, with a third impurity concentration, which is lower than said second impurity concentration, formed on said second surface thereof;

joining said second surface of said semiconductor anode substrate to said first surface of said semiconductor substrate;

heating said joined substrates to form an inversion layer on the side of said first surface of said semiconductor substrate by rediffusion of the impurities in said semiconductor anode substrate into said layer-like region, and a pn junction located between said layer-like region and said inversion layer;

forming a body region of said first conductivity type in said drain region, said body region being exposed at said second surface of said semiconductor substrate;

forming a source region of said second conductivity type in said body region, said source region being exposed at said second surface of said semiconductor substrate;

forming an insulating layer on an exposed portion of said drain region, an exposed portion of said body region, and an exposed portion of said source region; and forming a gate layer mounted on said insulating layer, said gate layer extending above a portion of said body region which is between said source and drain regions.

2. A method of manufacturing a conductivity modulation type semiconductor device according to claim 1, further including the steps of:

forming an anode electrode on said first surface of said semiconductor anode substrate; and forming a source electrode on the exposed surface of said source region.

3. A method of manufacturing a conductivity modulation type semiconductor device according to claim 2, in which said drain region has an impurity concentration of below $1 \times 10^{14}$ cm$^{-3}$; and said semiconductor anode substrate has an impurity concentration of above $1 \times 10^{14}$ cm$^{-3}$.

4. A method of manufacturing a conductivity modulation type semiconductor device according to claim 3, in which said semiconductor anode substrate has an impurity concentration of above $1 \times 10^{20}$ cm$^{-3}$.

5. A method of manufacturing a conductivity modulation type semiconductor device according to claim 3, in which said layer-like region has a thickness of 5 to 30 μm.

6. A method of manufacturing a conductivity modulation type semiconductor device, comprising the steps of:

preparing a semiconductor anode substrate of a first conductivity type having first and second surfaces, said semiconductor anode substrate having a region with a first impurity concentration on a side of said first surface;

preparing a semiconductor substrate of a second conductivity type having first and second surfaces, said semiconductor substrate having a layer-like region, with a second conductive impurity concentration, formed on said first surface thereof, said second conductive impurity concentration being higher than said first impurity concentration, and having a drain region with a third impurity concentration which is lower than said second impurity concentration, formed on said second surface thereof;

joining said second surface of said anode semiconductor substrate to said first surface of said semiconductor substrate;

heating said joined substrates to form an inversion layer between said region with said first impurity concentration of said semiconductor anode substrate and said layer-like region of said semiconductor substrate;

forming a body region of said first conductivity type in said drain region, said body region being exposed at said second surface of said semiconductor substrate;

forming a source region of said second conductivity type in said body region, said source region being exposed at said second surface of said semiconductor substrate;

forming an insulating layer on an exposed portion of said drain region, an exposed portion of said body region, and an exposed portion of said source region; and forming a gate layer mounted on said insulating layer, said gate extending above a portion said body region which is between said source and drain regions.

* * * * *